United States Patent
Konishi

(10) Patent No.: US 11,145,381 B1
(45) Date of Patent: Oct. 12, 2021

(54) MEMORY WITH TEST FUNCTION AND TEST METHOD THEREOF

(71) Applicant: Powerchip Semiconductor Manufacturing Corporation, Hsinchu (TW)

(72) Inventor: Yasuhiro Konishi, Osaka Fu (JP)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 17/015,086

(22) Filed: Sep. 9, 2020

(51) Int. Cl.
| G11C 29/10 | (2006.01) |
| G11C 29/38 | (2006.01) |
| G11C 29/12 | (2006.01) |
| G11C 7/10 | (2006.01) |
| G11C 7/06 | (2006.01) |
| G11C 29/00 | (2006.01) |

(52) U.S. Cl.
CPC ............. *G11C 29/10* (2013.01); *G11C 7/06* (2013.01); *G11C 7/1057* (2013.01); *G11C 7/1084* (2013.01); *G11C 29/1201* (2013.01); *G11C 29/38* (2013.01); *G11C 29/789* (2013.01); *G11C 2029/1204* (2013.01)

(58) Field of Classification Search
CPC ......... G11C 29/10; G11C 7/06; G11C 7/1057; G11C 7/1084; G11C 29/1201
See application file for complete search history.

(56) References Cited

U.S. PATENT DOCUMENTS

| 5,483,493 | A | 1/1996 | Shin | |
| 5,923,600 | A | 7/1999 | Momohara | |
| 6,058,495 | A | 5/2000 | Lee et al. | |
| 6,357,027 | B1 | 3/2002 | Frankowsky | |
| 6,591,384 | B1* | 7/2003 | Chou | G11C 29/26 365/201 |
| 7,246,280 | B2* | 7/2007 | Kim | G11C 29/28 714/719 |
| 2004/0085836 | A1* | 5/2004 | Lee | G11C 7/1048 365/201 |
| 2007/0195619 | A1* | 8/2007 | Rhie | G11C 11/404 365/200 |
| 2012/0170382 | A1* | 7/2012 | Do | G11C 29/1201 365/189.05 |

FOREIGN PATENT DOCUMENTS

TW 388883 5/2000

OTHER PUBLICATIONS

"Office Action of Taiwan Counterpart Application", dated Jul. 5, 2021, p. 1-p. 6.

* cited by examiner

*Primary Examiner* — Han Yang
(74) *Attorney, Agent, or Firm* — JCIPRNET

(57) ABSTRACT

A memory with a test function and a method thereof. The memory includes a memory array having cells, input buffers divided into even- and odd-numbered groups and output buffers divided into even- and odd-numbered groups; at least two data input pads, respectively providing test data to the cells through the even-numbered and the odd-numbered input buffers; a first and a second logic gates, respectively performing a first logic operation on outputs of the even-numbered and odd-numbered output buffers; a third logic gate, performing a second logic operation on outputs of the first and the second logic gates; and at least one data output pad, coupled to an output of the third logic gate for providing a test result of the cells.

17 Claims, 14 Drawing Sheets

MEMORY WITH TEST FUNCTION AND TEST METHOD THEREOF

BACKGROUND

Technical Field

The invention relates to a memory, and particularly to a memory with test function and test method thereof.

Description of Related Art

As the development of semiconductor memory progresses, the number of the I/O ports are significantly increased. A so-called hyper-multi I/O (ex. 512 I/O, 1024 I/O) memory, such as DRAM, may have a large number of I/O ports, such as 512, 1024 or more. Such memories are very effective solution to realize very high bandwidth between logic and memory on the chip.

However, on the other hand, testing the hyper-multi I/O DRAMs is very difficult, because an Automatic Test Equipment (ATE) has usually limited I/O driver-comparator resources and a probe card has also limited needle resources. In the case of DRAM and Logic on the same die, usually there is no further pad for I/O, so placing too many pads for testing is not realistic.

Therefore, testing the hyper-multi I/O DRAM and repairing defective memory cells are crucial to improve yield. There are needs to develop a memory configuration and a test method capable of reducing input pads and output pads for test.

SUMMARY

According to one embodiment of the disclosure, a memory with a test function is provided. The memory comprises a memory array, at least two data input pads, a first logic gate, a second logic gate, a third logic gate and at least one data output pad. The memory array has cells, a plurality of input buffers and a plurality of output buffers, in which the plurality of input buffers is divided into even-numbered input buffers and odd-numbered input buffers, and the plurality of output buffers is divided into even-numbered output buffers and odd-numbered output buffers. The at least two data input pads respectively provides test data to the cells through the even-numbered input buffers and the odd-numbered input buffers in a test write mode. The first logic gate performs a first logic operation on outputs of the even-numbered output buffers in a test read mode. The second logic gate performs the first logic operation on outputs of the odd-numbered output buffers in the test read mode. The third logic gate performs a second logic operation on outputs of the first and the second logic gates. The at least one data output pad, coupled to an output of the third logic gate for providing a test result of the cells.

According to one embodiment, the first and the second logic gates may be XOR gates, and the third logic gate may be an NOR gate.

According to one embodiment, the memory array may further comprise a plurality of sub-arrays arranged in a matrix form. Each of the plurality of sub-arrays may comprise a plurality of bit lines that are divided into a plurality of even-numbered bit-lines and a plurality of odd-numbered bit-lines. The even-numbered bit-lines and the odd-numbered bit-lines may be interposed each other. The test data from the even-numbered input buffers is written into the cells through the even-numbered bit-lines and the test data from the odd-numbered input buffers is written into the cells through the odd-numbered bit-lines.

According to one embodiment, each of the plurality of sub-arrays may further comprise a first set of local I/O lines connected to the even-numbered bit-lines via respective sense amplifiers; a second set of local I/O lines connected to the odd-numbered bit-lines via respective sense amplifiers; and a set of main I/O lines intersected with the first set of local I/O lines and the second set of local I/O lines.

According to one embodiment, the number of main I/O lines may be equal to numbers of the first and the second set of the local I/O lines.

According to one embodiment, each of the plurality of sub-arrays may further comprise a predetermined number of spare bit-lines for replace a defective bit line in the sub-array. In one embodiment, the predetermined number of spare bit-lines may be all replaced with the bit lines once the defective bit line in the sub-array is detected.

According to one embodiment, the memory may be a hyper-multi I/O semiconductor memory. In one embodiment, the hyper-multi I/O semiconductor memory is a hyper-multi I/O DRAM.

According to another embodiment of the disclosure, a method for testing a memory is provided, in which the memory has a memory array with a plurality of even-numbered and odd-numbered input buffers and a plurality of even-numbered and odd-numbered output buffers. The method comprises: writing test data into cells of the memory under test through the plurality of even-numbered and odd-numbered input buffers through at least two data input pads; reading the test data from the cells through the plurality of even-numbered and odd-numbered output buffers; performing a first logic operation on outputs of the plurality of even-numbered output buffers to obtain a first logic value and on outputs of the plurality of odd-numbered output buffers to obtain a second logic value; performing a second logic operation on the first and the second logic values to output a third logic value on at least one data output pad; and determines whether the cells are defective or not based on the third logic value.

According to one embodiment, in the above method, the test data from one of the at least two data input pads may be consecutively burst written into the even-numbered input buffers, and the test data from another one of the at least two data input pads is consecutively burst written into the odd-numbered input buffers.

According to one embodiment, in the above method, the first logic operation may be XOR and the second logic operation may be NOR.

According to one embodiment, in the above method, the memory array may further comprise a plurality of sub-arrays arranged in a matrix form, and each of the plurality of sub-arrays comprises a plurality of bit lines that are divided into a plurality of even-numbered bit-lines and a plurality of odd-numbered bit-lines. The method may further comprise: writing the test data from the even-numbered input buffers to the cells through the even-numbered bit-lines, and writing the test data from the odd-numbered input buffers to the cells through the odd-numbered bit-lines.

According to one embodiment, in the above method, each of the plurality of sub-arrays may further comprise a predetermined number of spare bit-lines, and the method comprises: replacing a defective bit line in the sub-array with the predetermined number of spare bit-lines.

According to one embodiment, in the above method, the predetermined number of spare bit-lines may be all replaced with the bit lines once the defective bit line in the sub-array is detected.

According to one embodiment, in the above method, the memory may be a hyper-multi I/O semiconductor memory. According to one embodiment, the hyper-multi I/O semiconductor memory may be a hyper-multi I/O DRAM.

As described, the I/O buffers of the memory array are divided into even-numbered group and odd-numbered group and at least two data input pads and at least one data output pad are provided for test. In this manner, the test for the hyper-multi I/O memory can be easily and possibly implemented with fewer test I/O pad. In addition, the test can be done by providing the logic gates without increasing the complexity of the memory configuration. Without placing too many pads for testing the memory, the method and circuit can be easily applied to a memory configuration with extra large number of I/Os.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The test circuit and method of the disclosure can be applied to various of memories, such as a semiconductor memory, having hyper-multiple I/O ports. In the following description, a DRAM is used as an example for easily understanding the disclosure, but not to limit the scope of the invention. Other possible memory can also run test operations based on the concept of the disclosure with suitable modification if necessary.

Figure 1:
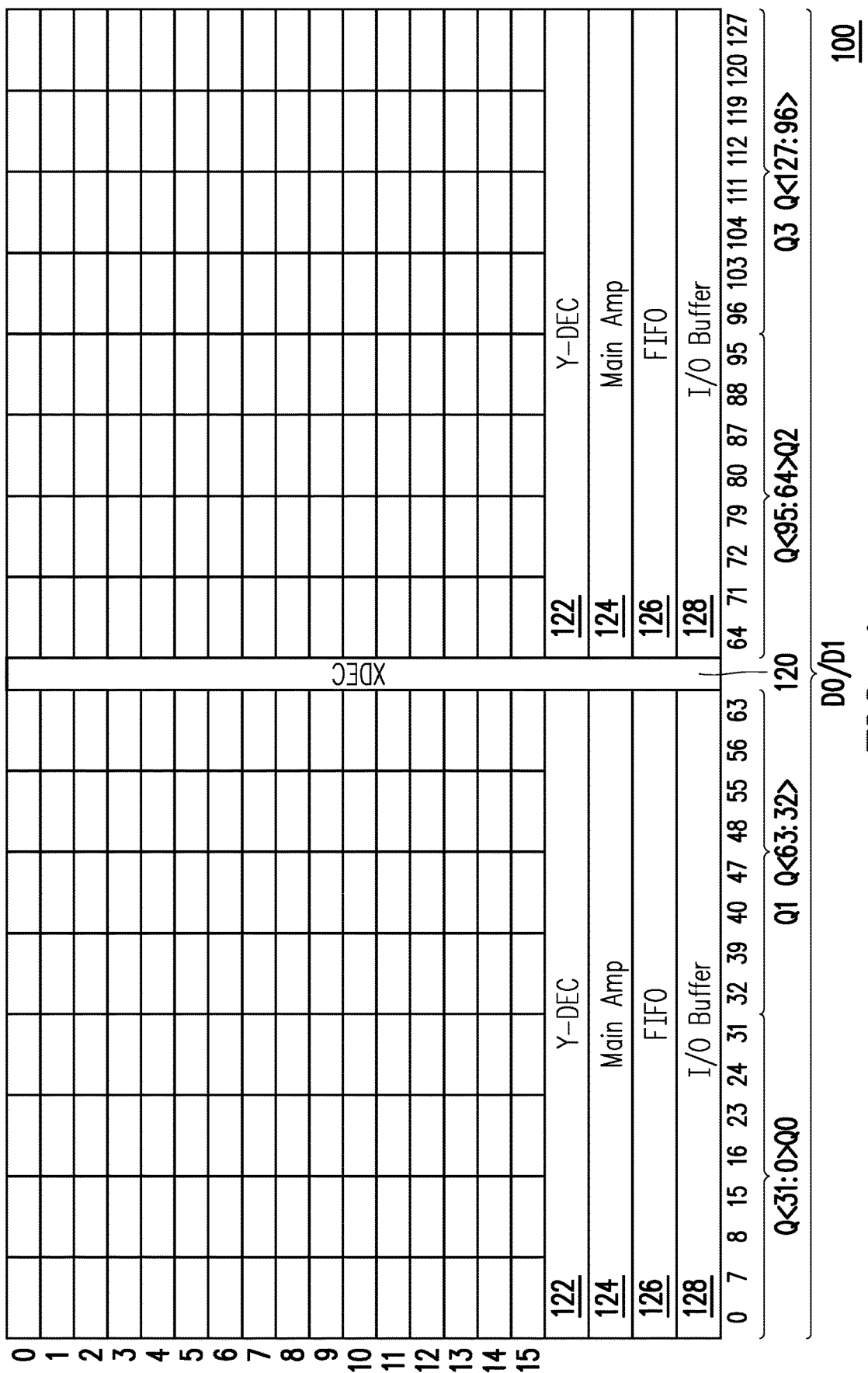
FIG. 1 shows an example of a hyper-multi I/O DRAM for brief description according to an embodiment of the disclosure.

FIG. 1 shows an example of a hyper-multi I/O DRAM for brief description according to an embodiment of the disclosure. In FIG. 1, the memory includes a memory array 100, an X-decoder 120, a Y-decoder 122, a main amplifier 124, FIFOs 126 and I/O buffers 128. Data may be written into or read from the I/O buffers 128 via data ports DQ <127:0>. The functions and operations of the basic circuit blocks of the are basically the same as or similar to the existing architecture, and the actual architecture does not affect the implementation of this embodiment, so detailed descriptions are omitted here.

In addition, as shown in FIG. 1, for operating the memory in the test mode according to the embodiment of the disclosure, at least two data input pads D0, D1 are included for providing test data to the I/O buffers 128 of memory array 100 in the test write mode, and at least one data output pad Q0 (or Q1, . . . ) is included for outputting a test result from the I/O buffers 128 in the test read mode.

In FIG. 1, as an example, the memory has 128 I/O buffers, two data input pads D0, D1, and four data output pads Q0 (Q <31:0>), Q1 (Q <63:32>), Q2 (Q <95:64>) and Q3 (Q <127:96>). The test data is written to the memory array 100 through the data input pads D0, D1, and the test results are output from the data output pads Q0~Q3.

Figure 2A:
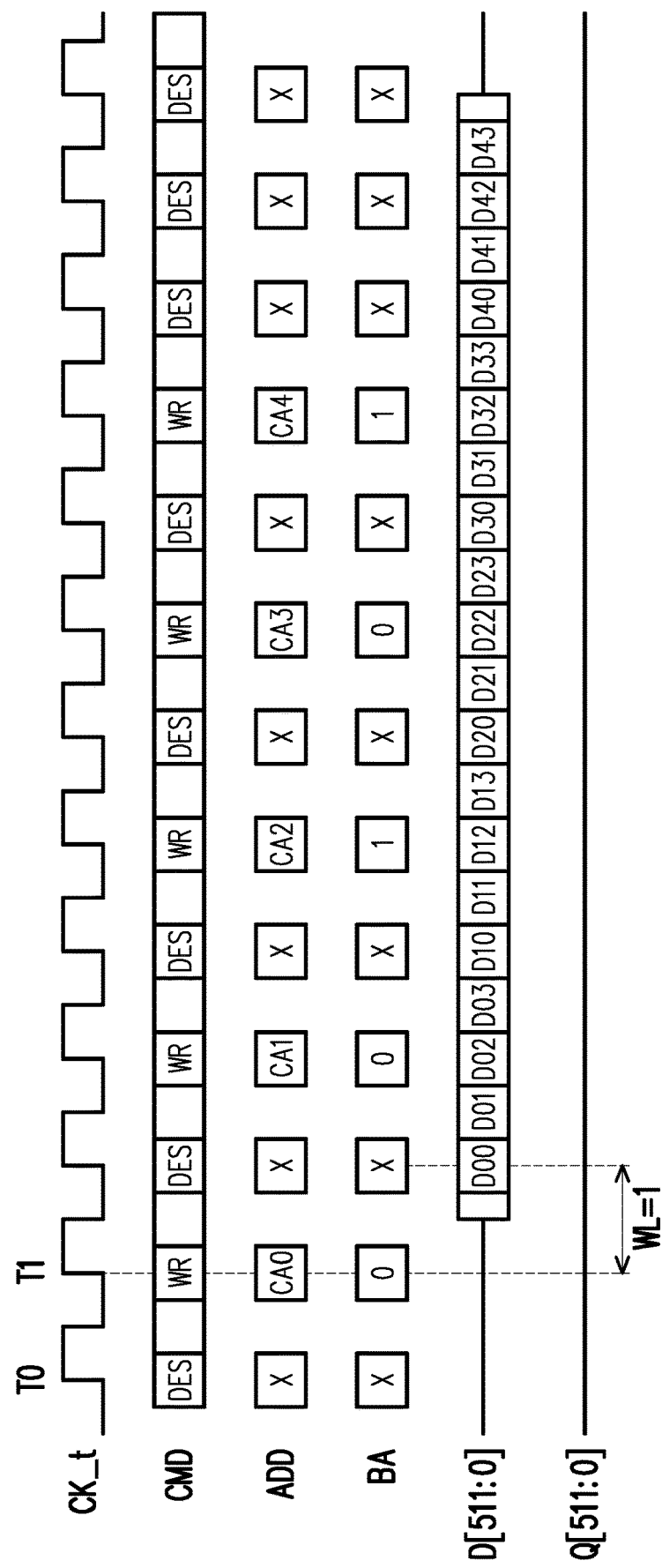
FIGS. 2A and 2B shows schematic time charts of consecutive burst write and burst read operation for a memory.
Figure 2B:
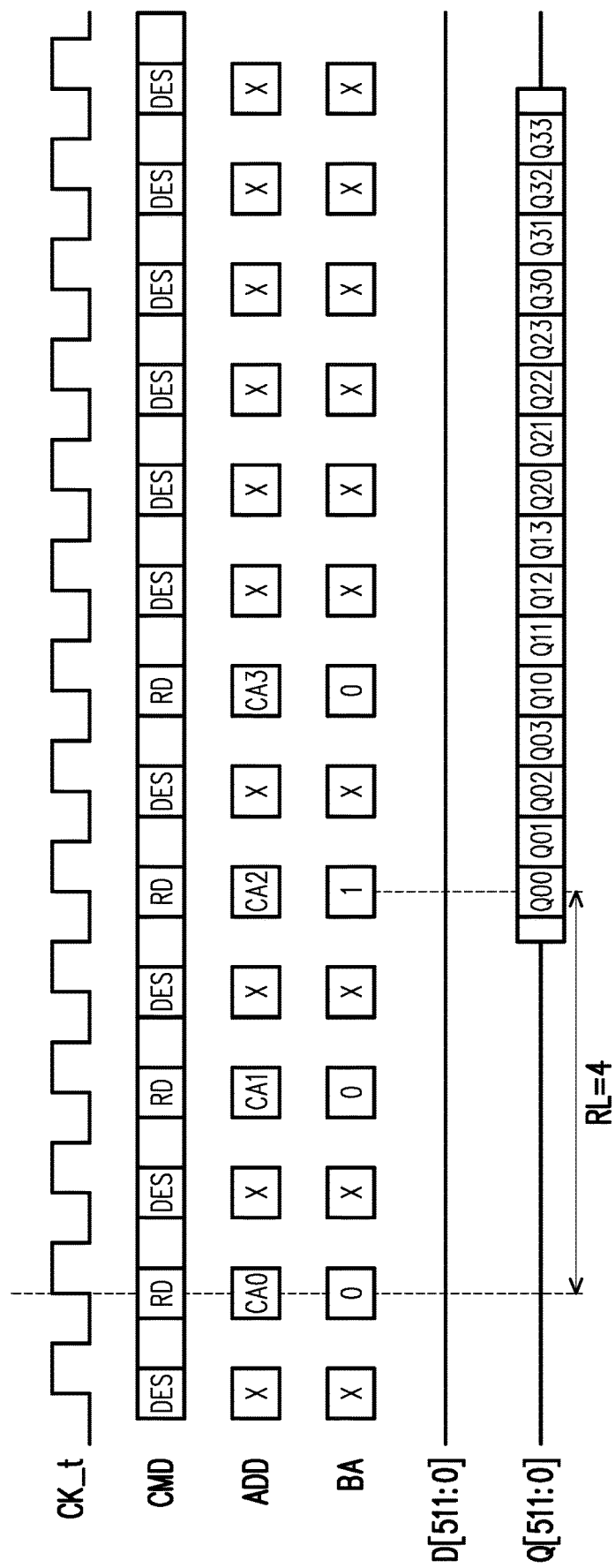

FIGS. 2A and 2B shows schematic time charts of consecutive burst write and burst read operation for a memory. As shown in FIG. 2A, at the timing T1 of clock signal CK_t, the command WR (write) is issued on the command line CMD, and the column address CAO and the bank number BAO are respectively selected and issued on the address line ADD and bank line BA, so that the data will be written to the cells on the selected bank 0 and the column address CAO. With a write latency WL=1, the data is started to be written to the selected cells at the timing T2. Then, at the timing T3, T5, . . . , the write command WR and the address ADD and bank BA are consecutively issued. As a result, the data D00, D01, D02, . . . , D43 is consecutively burst written into the selected cells through the ports D [511:0].

In FIG. 2B, a timing chart for consecutive burst read operation is briefly shown. As shown in FIG. 2B, As shown in FIG. 2A, at the timing T1 of clock signal CK_t, the command RD (read) is issued on the command line CMD, and the column address CAO and the bank number BAO are respectively selected and issued on the address line ADD and bank line BA, so that the data will be read from the cells on the selected bank 0 and the column address CAO. With a read latency RL=4, for example, the data is started to be read from the selected cells at the timing T5. Then, at the timing T3, T5, . . . , the read command RD and the address ADD and bank BA are consecutively issued. As a result, the data Q00, Q01, Q02, . . . , Q33 is consecutively burst read from the selected cells through the ports Q [511:0].

Therefore, in general, when there is test data to be written into or read from a hyper-multi I/O memory (such as DRAM) with the burst write and read, the same number for I/O pads for input and output of data is required. According to the disclosure, the data input pads will be reduced to at least two (D0, D1 in FIG. 1) and the data output pad will be reduced to at least one (Q0, Q2 in FIG. 1).

Figure 3A:
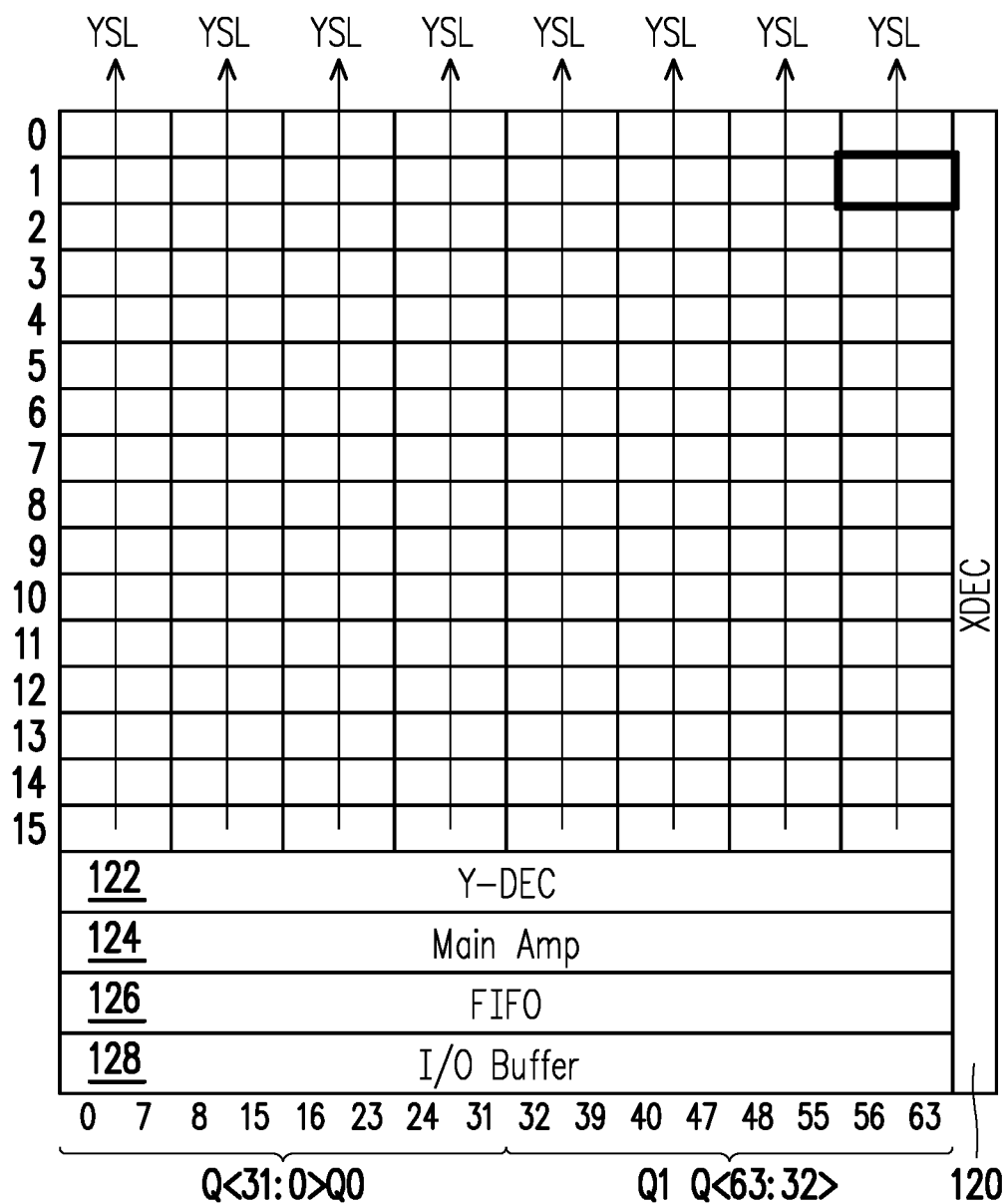
FIG. 3A shows a portion of the memory array in FIG. 1

FIG. 3A shows a portion of the memory array in FIG. 1. In FIG. 3A, the left part of the memory array 100 having 64 MB is depicted, and 8×16 sub-array are further included, i.e., the array is divided into 16 parts (0-15) in the column direction (bit line direction) and into 8 parts in the row direction (word line direction), i.e., in a matrix form. The sub-arrays in the same column are further connected by a select line YSL. For example, the YSL may be used to connect 8 BL pairs to 8 local I/O (LIO) pairs.

Figure 3B:
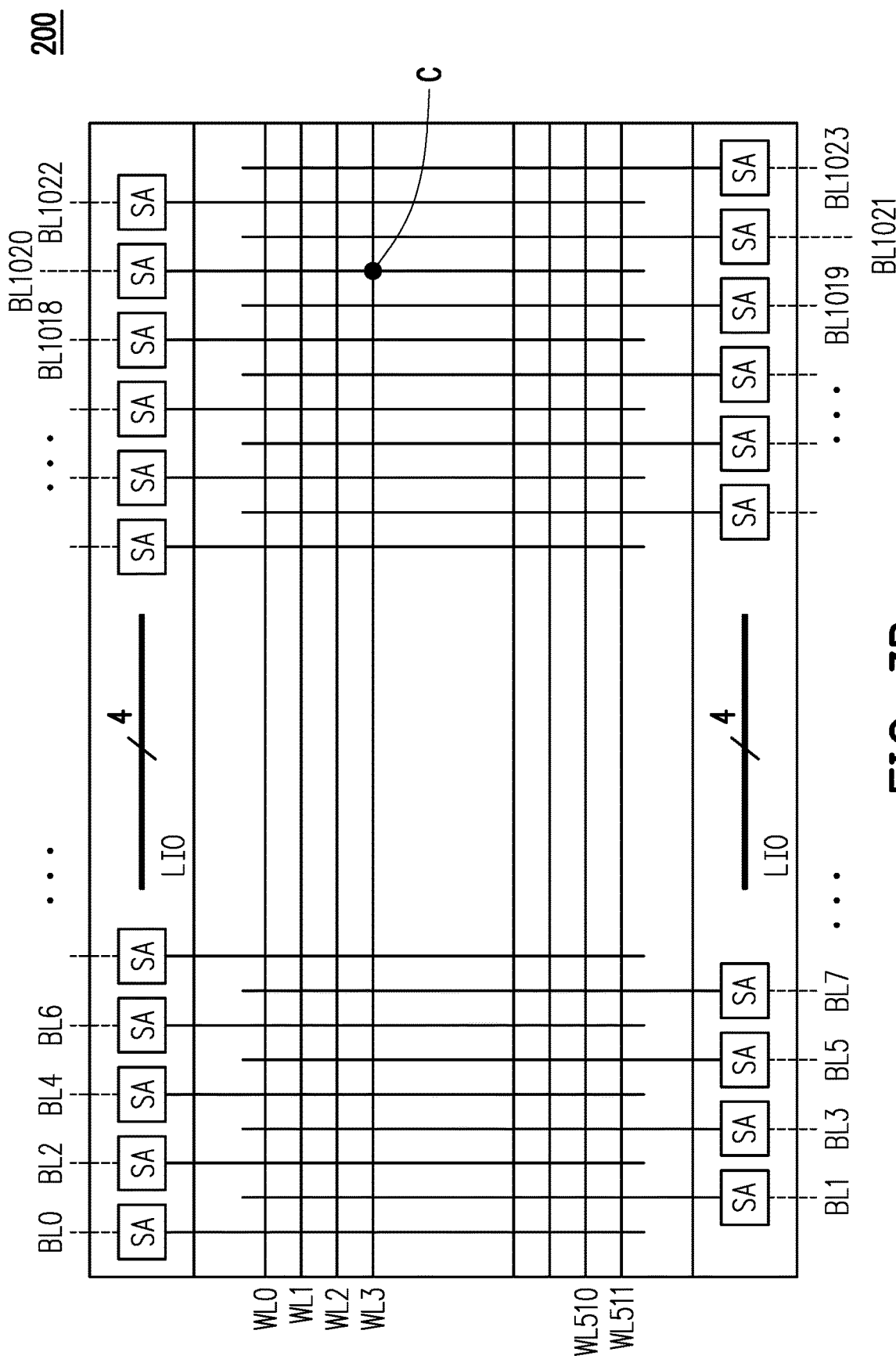
FIG. 3B shows a sub-array of the memory array shown in FIG. 3A.

FIG. 3B shows a sub-array of the memory array shown in FIG. 3A. As shown in FIG. 3B, the sub-array 200 in FIG. 3B further includes a plurality of word lines WL, a plurality of bit lines BL intersected with the plurality of word lines, and a plurality of memory cells C each of which is located on each intersection of the word lines and bit lines. In addition, a plurality of sense amplifiers (SA) is further included to respected connected to the corresponding bit line. In the example shown in FIG. 3B, there are 512 word lines (WL0~WL511), 1024 bit lines BL (BL0~BL1023) and 1024 sense amplifiers (512 SAs are arranged in the upper part and another 512 SAs are arranged in the lower parts in the sub-array 200).

Figure 3C:
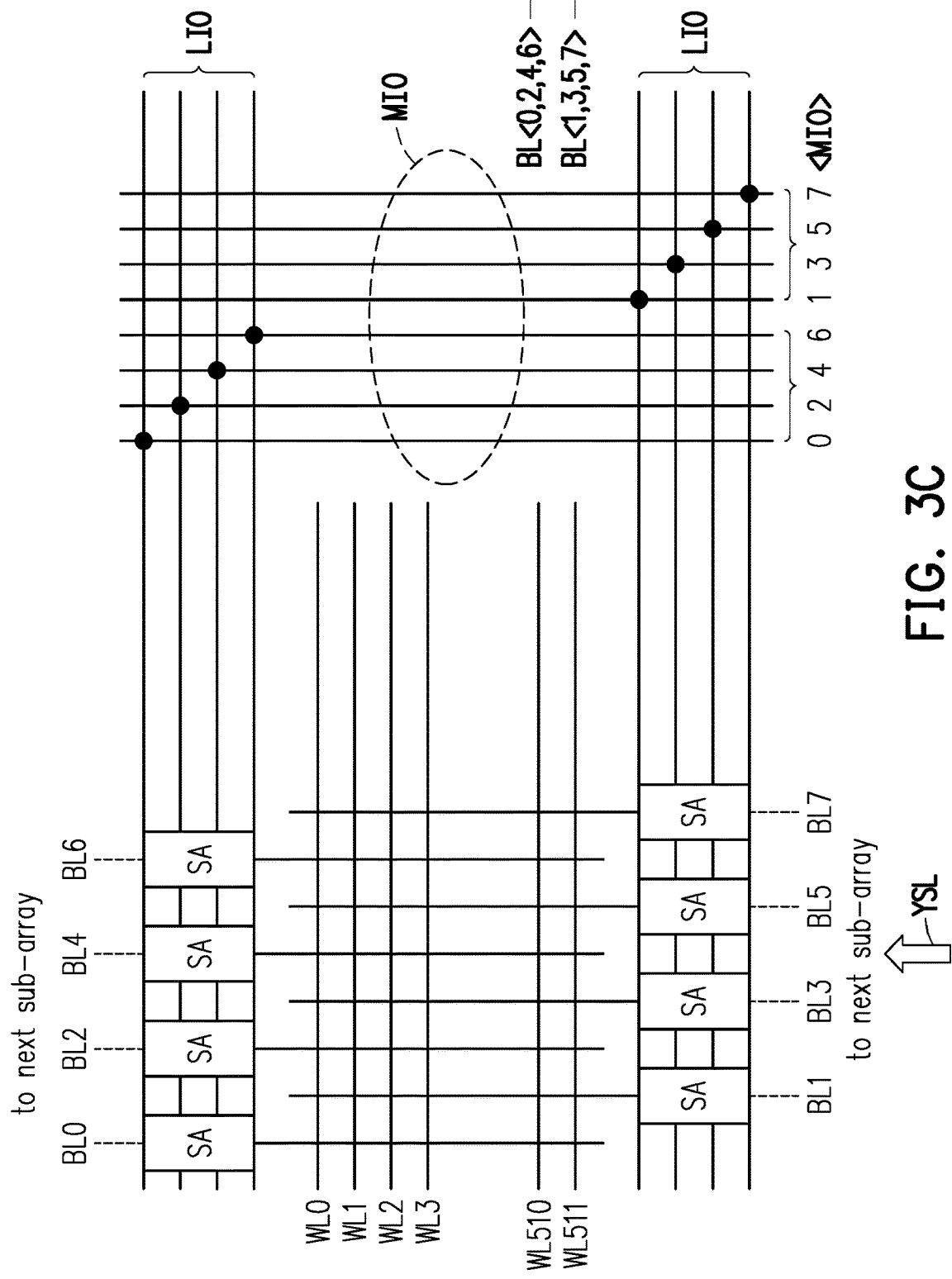
FIG. 3C shows a portion of the sub-array shown in FIG. 3B.

FIG. 3C shows a portion of the sub-array shown in FIG. 3B. In FIG. 3C, bit lines BL0~BL7, 8 pairs of LIO and 8 pairs of main I/O (MIO) are depicted. For example, the even-numbered bit lines BL0, BL2, BL4 and BL 6 are respectively connected to the 4 pairs of LIO (first set) in the upper part of the sub-array 200 and the odd-numbered bit lines BL1, BL3, BL5 and BL7 are respectively connected to another 4 pairs of LIO (second set) in the lower part of the sub-array 200. In addition, 8 pairs of MIO are intersected with the two sets of 4 pairs of LIO in the upper and lower parts of the sub-array 200. In this case, bit lines BL <0, 2, 4, 6> are respectively connected to the MIO <0, 2, 4, 6> and bit lines BL <1, 3, 5, 7> are respectively connected to the MIO <1, 3, 5, 7>. Thus, data may be burst read from or burst written to the bit lines BL <0, 2, 4, 6> respectively connected to the MIO <0, 2, 4, 6> through the even-numbered data port DQ <even>, and data may be burst read from or burst written to the bit lines BL <1, 3, 5, 7> respectively connected to the MIO <1, 3, 5, 7> through the odd-numbered data port DQ <odd>.

In the configuration shown in FIG. 3C, the sub-array 200 further comprise multiple bit-lines such as BL0~BL1023, and the multiple bit-lines BL0~BL1023 are also divided into even-numbered bit lines BL0, BL2, BL4, BL1022 and odd-numbered bit lines BL1, BL3, BL5, . . . , BL1023, in which the even-numbered bit lines BL0, BL2, BL4, BL1022 and odd-numbered bit lines BL1, BL3, BL5, BL1023 are interposed each other. In addition, the test data from the even-numbered input buffers De (from the data input pad D0) are written to the even-numbered bit-lines such as BL0, BL2, BL6 and the test data from the odd-numbered input buffers Do (from the data input pad D1) are written to the odd-numbered bit-lines such as BL1, BL3, BL7.

Figure 3D:
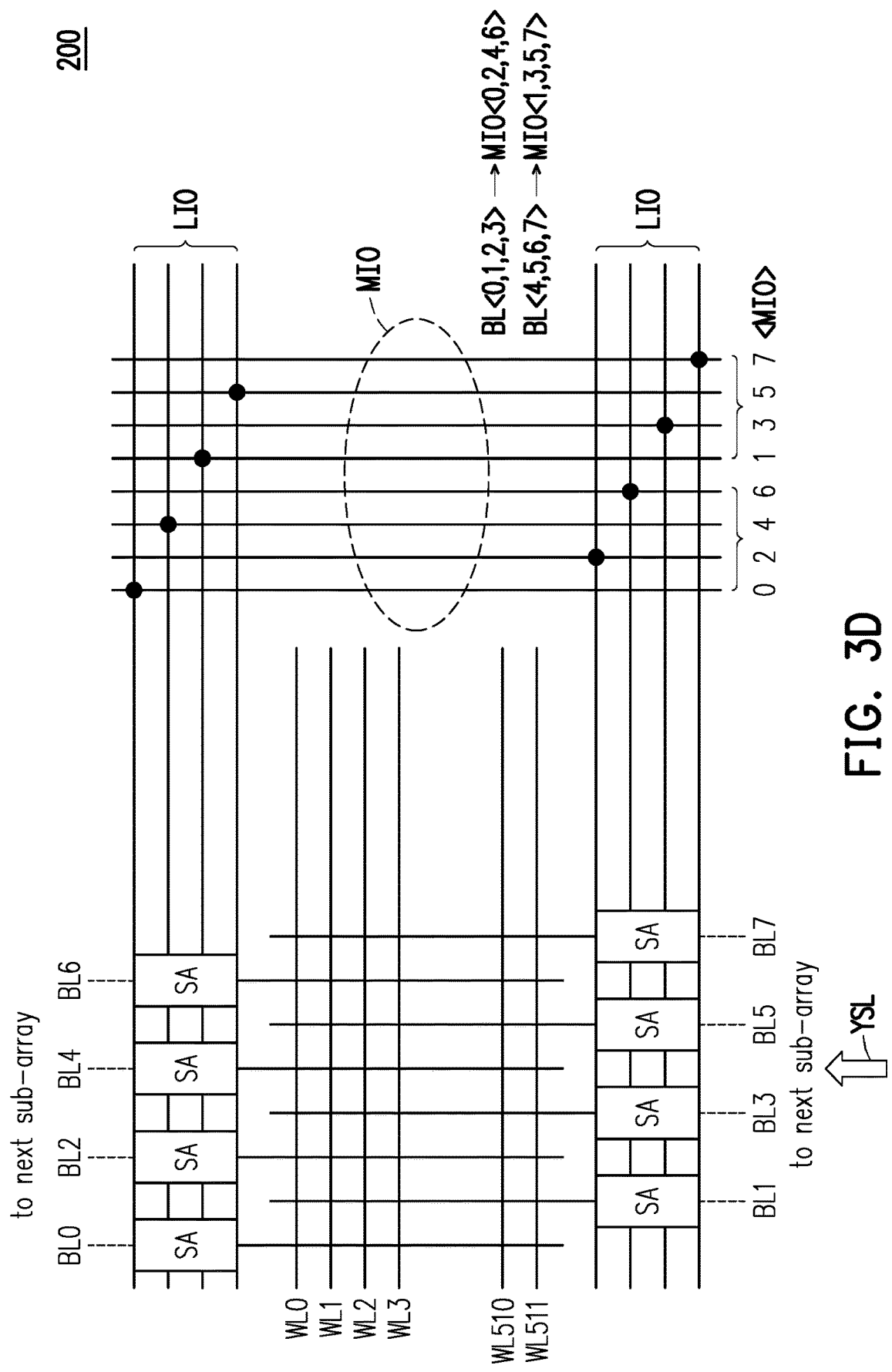
FIG. 3D shows a variation of FIG. 3C.

FIG. 3D shows a variation of FIG. 3C. As shown in 3D, in this case, bit lines BL <0, 1, 2, 3> are respectively connected to the MIO <0, 2, 4, 6> and bit lines BL <4, 5, 6, 7> are respectively connected to the MIO <1, 3, 5, 7>. Thus, data may be burst read from or burst written to the bit lines BL <0, 1, 2, 3> respectively connected to the MIO <0, 2, 4, 6> through the even-numbered data port DQ <even>, and data may be burst read from or burst written to the bit lines BL <4, 5, 6, 7> respectively connected to the MIO <1, 3, 5, 7> through the odd-numbered data port DQ <odd>. The mapping between the bit lines BL and MIO can be properly modified based on design needs. In addition, through the select line YSL, 8 adjacent bit lines BL can be selected among the bit lines BL0~BL1023 according to the received address.

Figure 4:
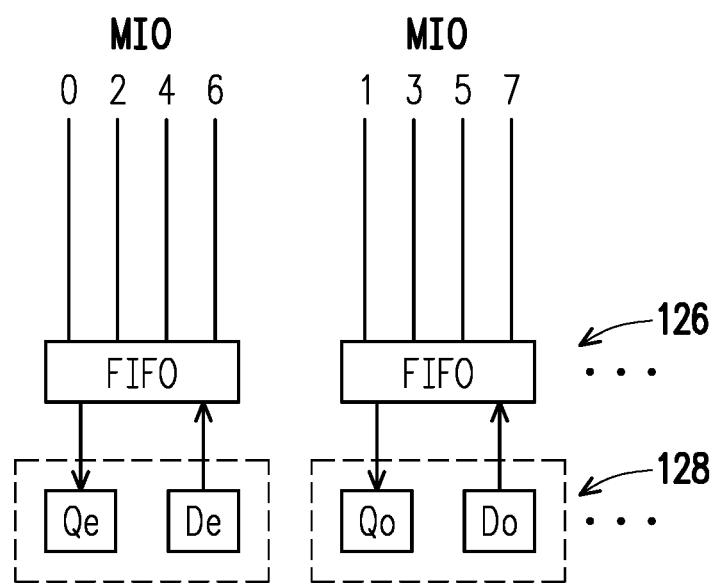
FIG. 4 shows an I/O buffer configuration according to the embodiment of the disclosure.

FIG. 4 shows an I/O buffer configuration according to the embodiment of the disclosure. As shown in FIG. 4, the I/O buffers 128 in FIG. 1 may comprise input buffers D and output buffers Q. The input buffers D may be further divided into even-numbered input buffers De and odd-numbered input buffers Do, and the output buffers Q may be further divided into even-numbered output buffers Qe and odd-numbered output buffers Qo.

According to the embodiment of the disclosure, the test data may be burst written into the cells of the memory array 100 through at least two data input pads D0, D1. For example, the test data is burst written into even-numbered input buffers De <0, 2, 4, 6, 8 . . . > of the memory through the data input pads D0 and into odd-numbered input buffers Do <1, 3, 5, 7, 9, . . . > of the memory through the data input pads D1. After the test data is written into the input buffers 128, the test data will be sequentially transferred to the corresponding FIFOs 126 for each sub-array. Then, the test data is transmitted through the MIO <0, 2, 4, 6> and MIO <1, 3, 5, 7> and further written into the cells through the 8 pairs of LIO as shown in FIGS. 3A-3D. In this manner, the test data is consecutively written to the cells under test. In the test read mode, the test data previously written into the cells will be read. The test data is transmitted through the MIO <7:0>, and then sequentially to the FIFO 126 and the output buffer 128.

Next, the test circuit and method for a memory will be further described in detail with reference to FIGS. 5A-5C, FIGS. 6A-6C and FIG. 7.

Figure 5A:
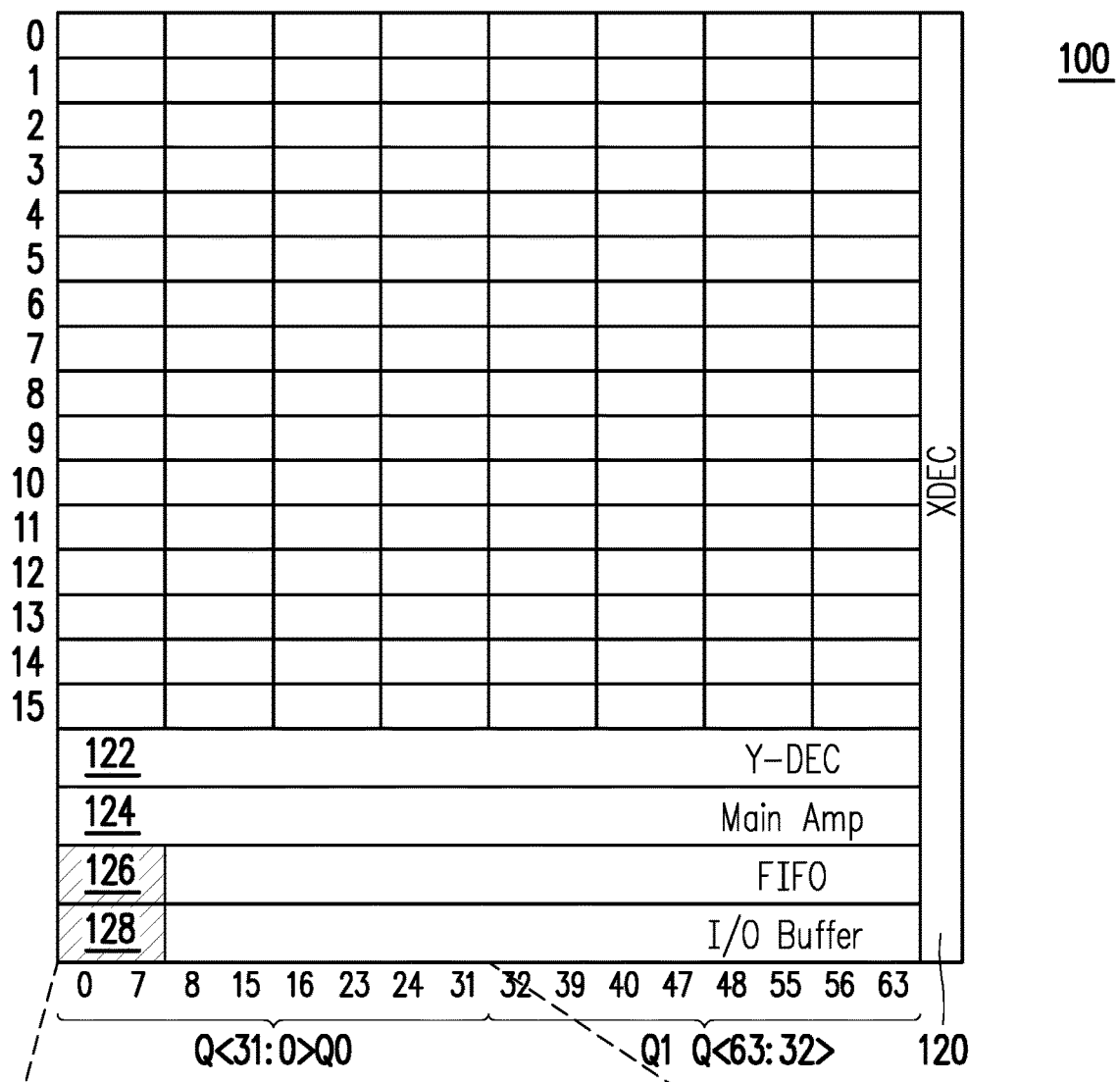
FIGS. 5A-5C show a concept diagram for performing a test mode write according to the embodiment of the disclosure.
Figure 5B:
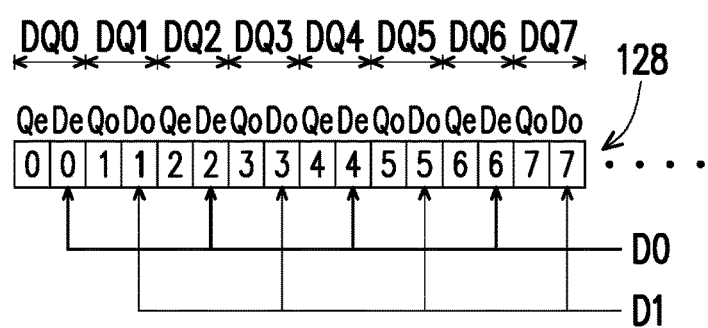
Figure 5C:
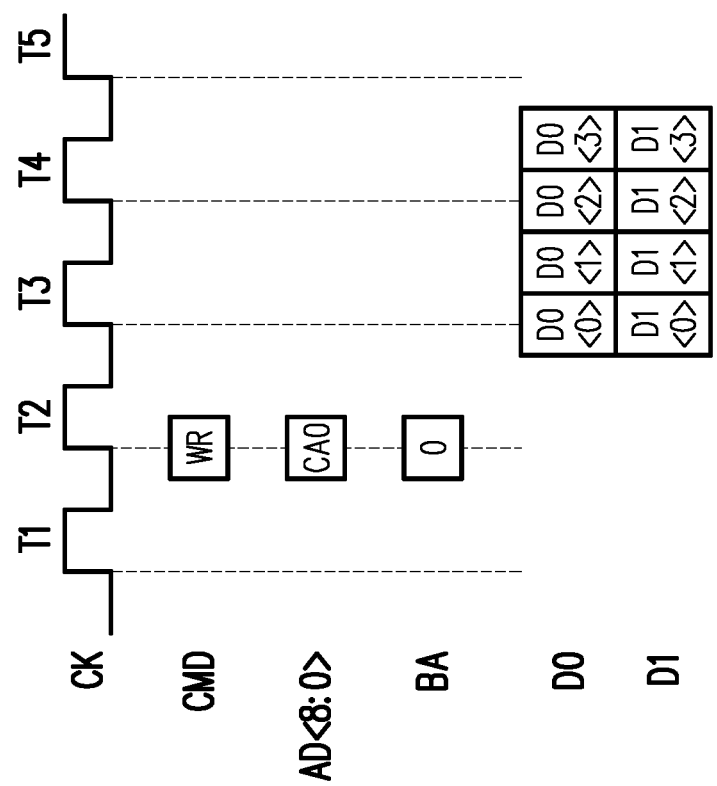

FIGS. 5A-5C show a concept diagram for performing a test mode write according to the embodiment of the disclosure. In FIG. 5A, the left part (for example, a size of 64 MB) of the memory array 100 (refer to FIG. 1) is illustrated, and there are 64 ports DQ <63:0> used as the I/O ports. In FIG. 5A, an example that test data is written to the input buffers 5A, i.e., data length of 8, but the invention is not intendedly limited thereto. The data length may be modified based on design needs, such as D <31:0> or D <63:0>.

FIG. 5B shows a schematic diagram how the test data for test is written into the input buffers 128 (burst write). As shown in FIG. 5B, the I/O buffers 128 further comprise input buffers D <0, 1, 2, 3, 4, . . . > and output buffers Q <0, 1, 2, 3, 4, . . . >. According to the embodiment of the disclosure, the input buffers D <0, 1, 2, 3, 4, . . . > are further divided into even-numbered input buffers De <0, 2, 4, 6, . . . > and odd-numbered input buffers Do <1, 3, 5, 7, . . . >, and the out buffers Q <0, 1, 2, 3, 4, . . . > are further divided into even-numbered input buffers Qe <0, 2, 4, 6, . . . > and odd-numbered input buffers Qo <1, 3, 5, 7, . . . >.

In the test mode write, the test data, which is provided externally, is consecutively written into the cells under test through the input buffers D <0, 1, 2, 3, 4, . . . > using two paths D0, D1. Namely, the test data will be written into the even-numbered input buffers De <0, 2, 4, 6, . . . > using the data input pad D0 and into the odd-numbered input buffers Do <1, 3, 5, 7, . . . > using the data input pad D1. In this way, the test data from the data input pad D0 and the test data from the data input pad D1 can be concurrently written into the even-numbered input buffers De <0, 2, 4, 6, . . . > and the odd-numbered input buffers Do <1, 3, 5, 7, . . . >. In other embodiments, the data input pads may be four (D0~D3), or more, which depends on design needs.

As shown in FIG. 5C, at timing T2 of clock signal CK, the command CMD of write WR is issued, address AD <8:0> of CA0 is issued and bank 0 (BA) is selected to be written. Then, at timing T3 of clock signal CK, the test data to be written is consecutively written through the data input pads D0 and D1. The test data, which is written to the cells of the memory array 100 through the data input pad D0, is written to the even-numbered input buffers De <0, 2, 4, 6, 8, . . . >, and the test data, which is written to the cells of the memory array 100 through the data input pad D1, is written to the odd-numbered input buffers Do <1, 3, 5, 7, 9, . . . >.

Therefore, since one memory chip can share two common data input pads D0, D1 and the input buffers are divided into even- and odd-numbered input buffers, the input pads for receiving the test data can be significantly reduced. In addition, any test data pattern can be written into the adjacent cells to detect defective cells by using the data input pads D0/D1.

After the test data is written to the memory, and the test mode read will be performed to complete the test operation. Next, the test mode read is further described in details as follows.

Figure 6A:
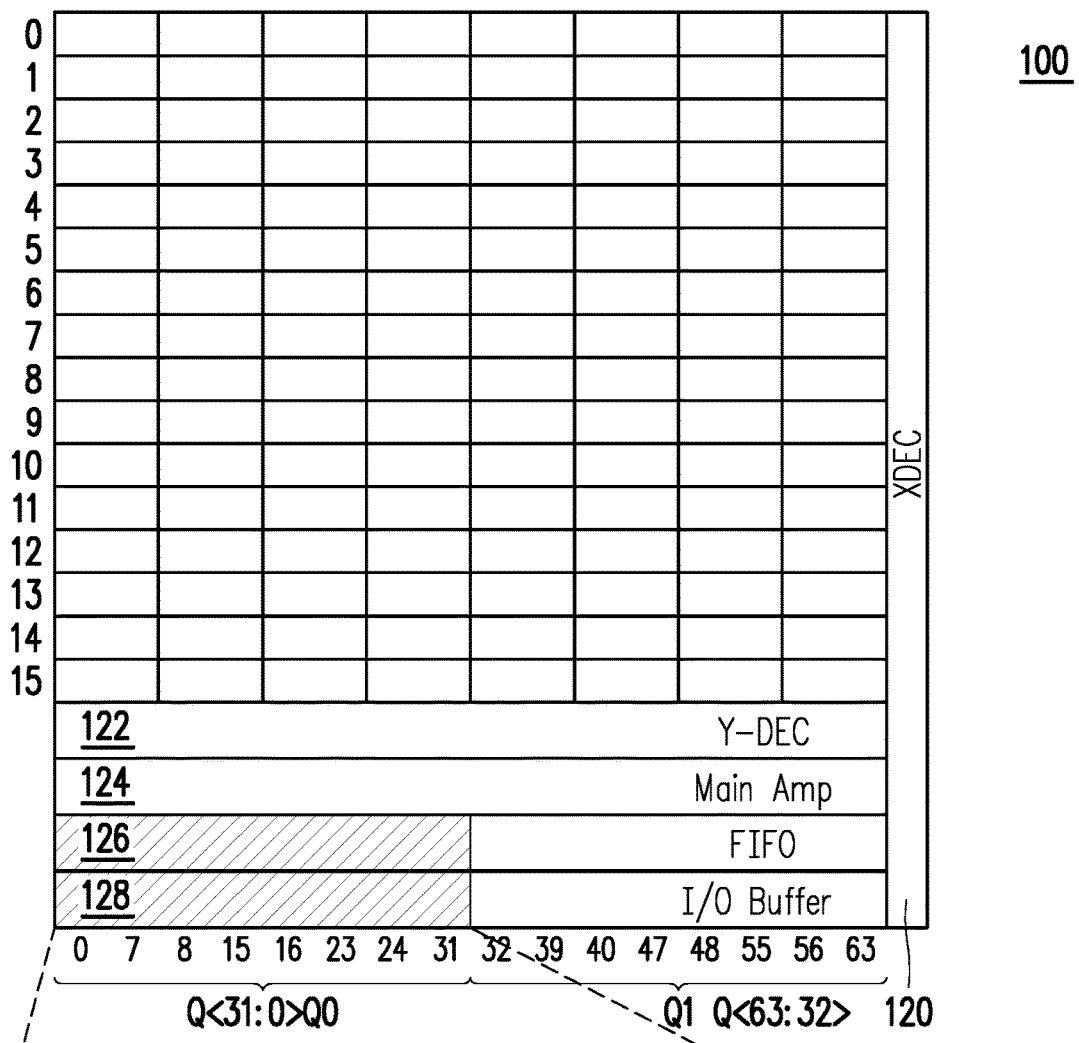
FIGS. 6A-6C show a concept diagram for performing a test mode read according to the embodiment of the disclosure.
Figure 6B:
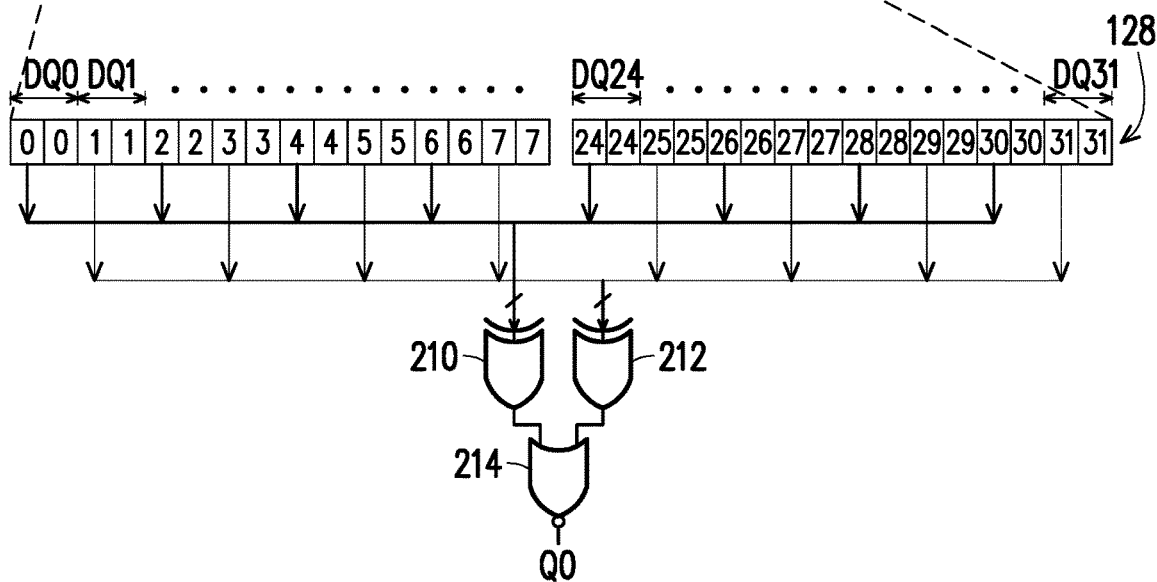
Figure 6C:
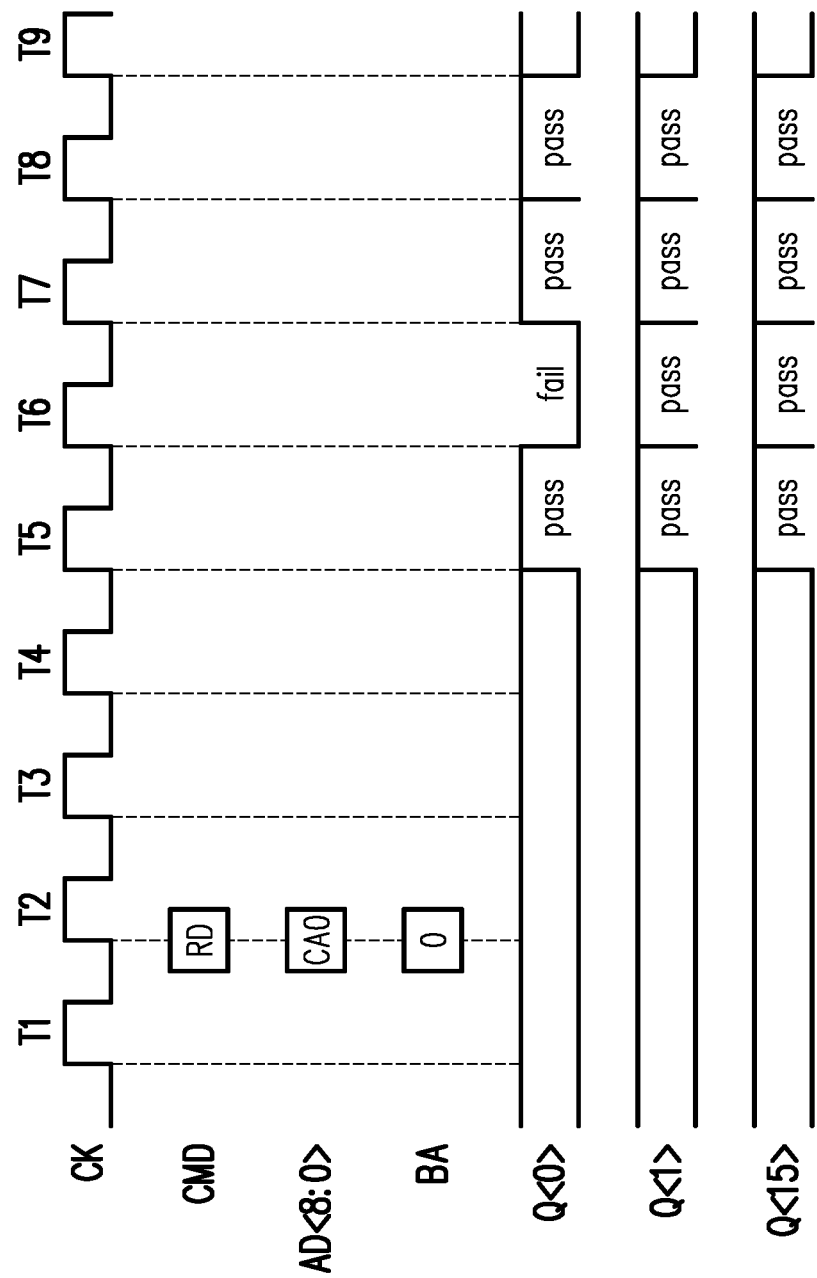

FIGS. 6A-6C show a concept diagram for performing a test mode read according to the embodiment of the disclosure. In FIG. 6A, the left part (for example, a size of 64 MB) of the memory array 100 (refer to FIG. 1) is illustrated, and there are 64 ports DQ <63:0> used as the I/O ports. In FIG. 6A, an example that test data is read from the output buffers Q <31:0>, i.e., data length of 32, but the invention is not intendedly limited thereto. The data length may be modified based on needs, such as Q <64:0> or longer. In addition, in this embodiment, two data output pads Q0 and Q1 are provided for provided test results. The data output pad Q0 can be provided to output a test result from the outputs of the output buffers Q <31:0> and the output pad Q1 can be provided to output a test result from the outputs of the output buffers Q <63:32>.

The test mode read will be further described with reference to FIGS. 6B and 6C. In FIG. 6B, the test mode read will be described in a case that the test data (burst read) is read from the output buffers Q <31:0> corresponding to ports DQ0~DQ31. The output buffers Q <31:0> are also divided into even-numbered output buffers Qe <0, 2, 4, 6, . . . , 30> and odd-numbered output buffers Qo <1, 3, 5, 7, . . . , 31>.

As shown in FIG. 6C, at timing T2 of clock signal CK, the command CMD of read RD is issued, address AD <8:0> of CA0 is issued and bank 0 (BA) is selected to be read. Then, at timing T5 of clock signal CK, the test result "pass" or "fail" are continuously provided through the data output pads Q0, Q1, . . . , Q15.

The test data previously written to the cells is consecutively read in a burst manner through the output buffers Q <31:0>. Namely, the test data is read from the cells, and then transmitted to the output buffers Q <31:0> via the FIFO 126.

In addition, the test circuit may further comprise a first logic gate 210, a second logic gate 212 and a third logic gate 214. According to one embodiment of the disclosure, the first logic gate 210 and the second logic gate 212 may be XOR gates and the third logic gate 214 may be a NOR gate. The XOR gates 210, 212 and the NOR gate 214 will be used to describe the test operation without intended limitations. As shown in FIG. 6B, the outputs of the even-numbered output buffers Qe <0, 2, 4, . . . , 30> are input to the XOR gate 210 and the outputs of the odd-numbered output buffers Qo <1, 3, 5, . . . , 31> are input to the XOR gate 212. Then, the outputs (a first logic value and a second logic value) of the XOR gates 210, 212 are input to the NOR gate 214, and generates a test result that is then output through the data output pad Q0. The value Q0 on the data output pad Q0 will indicates the test result to show the cells under test are defective or not.

In addition, the arrangement of the first to the third logic gates 210, 212, 214 is corresponding for each data output pad. If two data output pads Q0, Q1 are provides, two sets of the first to the third logic gates 210, 212, 214 are also provided for performing the logic operation for each data output pad.

When every even-numbered output buffers Qe <0, 2, 4, . . . , 30> has the same data and every odd-numbered output buffers Qo <1, 3, 5, . . . , 31> has the same data, the output of XOR gate 210 should be "0", i.e., "pass" (no defective), and the output of the XOR gate 212 (odd DQs) should be 0, i.e., "pass", otherwise the output of the XOR gate 210 or 212 will be 1, i.e., "fail" (defective is found). When the two outputs of the XOR gates 210, 212 are 0, the output of the NOR gate 214 will be "1", i.e., "pass", which means the cells are not defective. In contrast, when the two outputs of the XOR gates 210, 212 are not all 0, the output of the NOR gate 214 will be "0", i.e., "fail", which means the cells are defective.

In summary, the disclosure provides a configuration a memory with a test function. The memory may comprise a memory array, at least two data input pads D0, D1, a first logic gate 210, a second logic gate 212, a third logic gate 214 and at least one data output pad Q0. The memory array has cells, a plurality of input buffers (such as D <511:0>) and a plurality of output buffers (such as Q <511:0>), in which the plurality of input buffers D <511:0> is divided into even-numbered input buffers De <0, 2, 4, . . . , 510> and odd-numbered input buffers Do <1, 3, 5, . . . , 511>, and the plurality of output buffers Q <511:0> is divided into even-numbered output buffers Qe <0, 2, 4, . . . , 510> and odd-numbered output buffers Qo <1, 3, 5, . . . , 511>. The at least two data input pads D0, D1 respectively provides test data to the cells through the even-numbered input buffers De <0, 2, 4, . . . , 510> and the odd-numbered input buffers Do <1, 3, 5, . . . , 511> in a test write mode. The first logic gate 210 performs a first logic operation (such as XOR) on outputs of the even-numbered output buffers Qe <0, 2, 4, . . . , 510> in a test read mode. The second logic gate performs the first logic operation on outputs of the odd-numbered output buffers Qo <1, 3, 5, . . . , 511> in the test read mode. The third logic gate 214 performs a second logic operation (such as NOR) on outputs of the first and the second logic gates 210, 212. The at least one data output pad Q0, coupled to an output of the third logic gate 214 for providing a test result (such as "pass" or "fail") of the cells.

In the above configuration, by dividing the I/O buffers into even-numbered group and odd-numbered group and providing at least two data input pads and at least one data output pad, the test for the hyper-multi I/O memory can be easily and possibly implemented with fewer test I/O pad.

Figure 7:
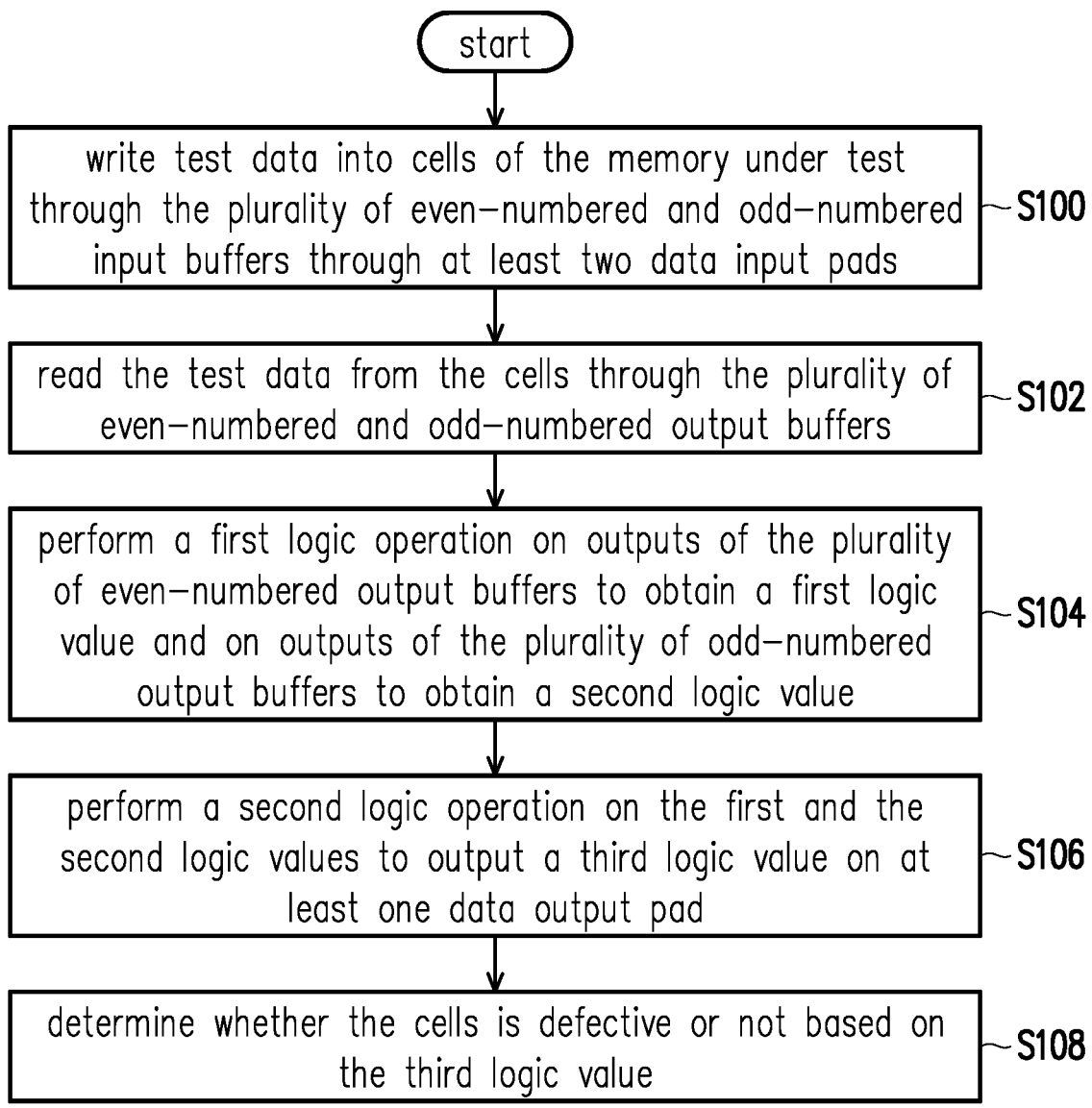
FIG. 7 shows a flow chart for testing cells of a hyper-multi IO memory according the embodiment of the disclosure.

FIG. 7 shows a flow chart for testing cells of a hyper-multi IO memory according the embodiment of the disclosure. As shown in FIG. 7 and FIGS. 5A-5B, at step S100, test data is written into cells of the memory under test through the plurality of even-numbered and odd-numbered input buffers through at least two data input pads. For example, the test data from the data input pad D0 is consecutively written into the even-numbered input buffers De <0, 2, 4, 6, . . . , 62> and the test data from the data input pad D1 is consecutively written into the odd-numbered input buffers Do <1, 3, 5, 7, . . . , 63>. In the embodiment, two data input pads (or lines) are used for inputting the test data, and testing the hyper-multi I/O memory (such as DRAMs) can become easy and possible.

Next, at step S102, the test data is read from the cells through the plurality of even-numbered and odd-numbered output buffers. For example, as shown in FIG. 6B, the test data is read from the even-numbered output buffers Qe <0, 2, 4, 6, . . . , 30> and the odd-numbered output buffers Qo <1, 3, 5, 7, . . . , 31>.

At step S104 and as shown in FIG. 6B, a first logic operation on outputs of the plurality of even-numbered output buffers to obtain a first logic value and on outputs of the plurality of odd-numbered output buffers to obtain a second logic value. The first logic operation may be an XOR. In this example, the outputs of the plurality of even-numbered output buffers Qe <0, 2, 4, 6, . . . , 30> is provided to the XOR gate 210 and generates the first logic value (i.e., the output of the XOR gate 210), and the outputs of the plurality of odd-numbered output buffers Qo <1, 3, 5, 7, . . . , 31> is provided to the XOR gate 212 and generates the second logic value (i.e., the output of the XOR gate 212).

At step S106, a second logic operation is further performed on the first and the second logic values to output a third logic value on at least one data output pad. The second logic operation may be a NOR. In this example, the outputs of the XOR gates 210, 212, i.e., the first and the second logic values, are provided to the NOR gate 214, and the third logic value, i.e., the output of the NOR gate 214 is output through the data output pad Q0. The test operation on the output buffers Q <63:32> will be the same, and the data output pad Q1 will output the test result according to the test read of the output buffers Q <63:32>.

At step S108, whether the cells are defective or not can be determined based on the third logic value. Therefore, according to the Q0, Q1 (the third logic value), it can indicate that the cells under test are pass (logic "1") or fail (logic "0").

According the test method of the disclosure, at least two data input pads (D0, D1) and at least one data output pad (Q0) are used for testing the hyper-multi IO memory, and make the test for the memory having extra-large number of I/Os easy and possible to perform without placing too many pads for testing the memory.

Figure 8:
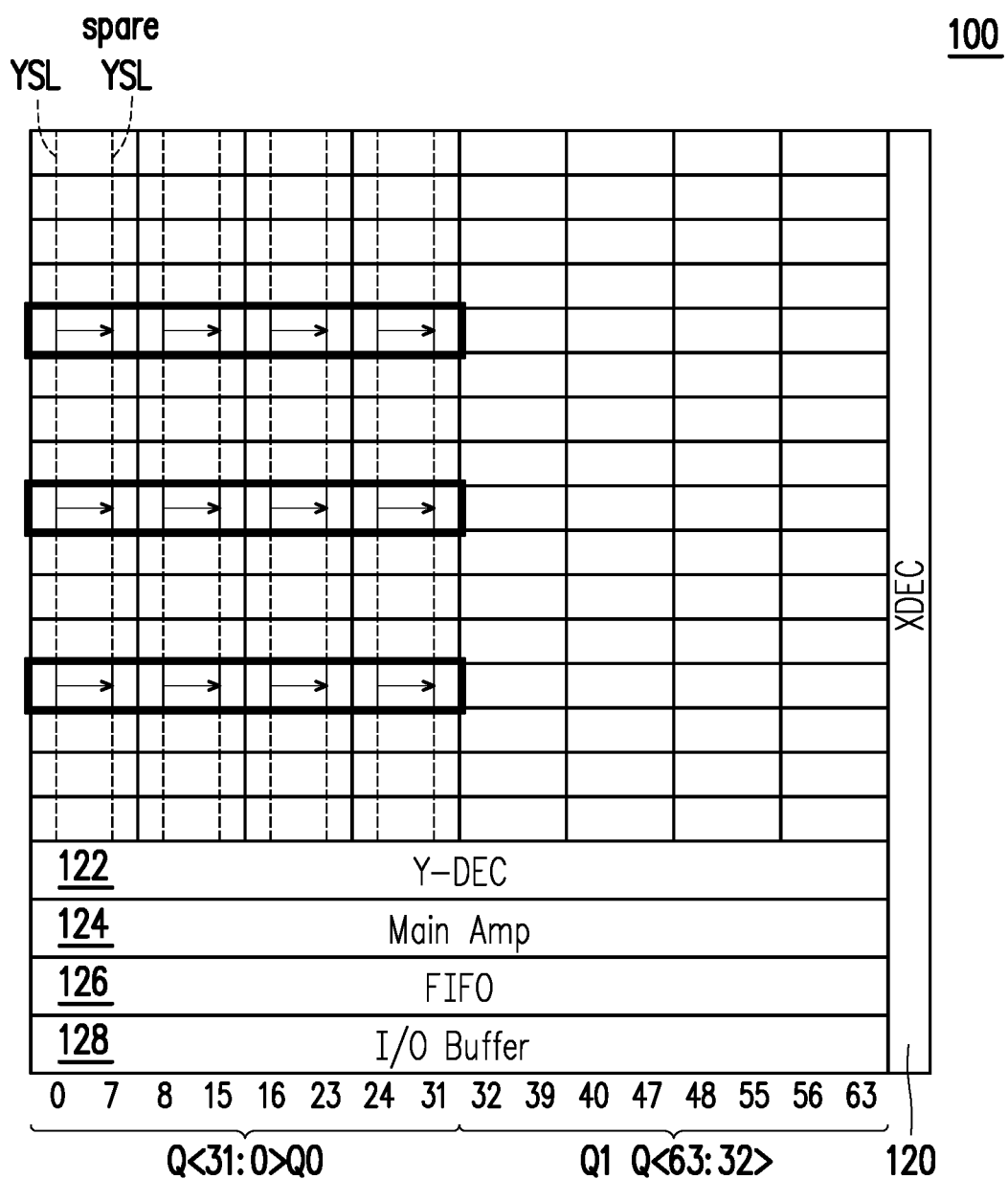
FIG. 8 shows a schematic redundancy scheme for the embodiment of the disclosure.

FIG. 8 shows a schematic redundancy scheme for the embodiment of the disclosure. As shown in FIG. 8 in the embodiment, four spare YSL lines (bit lines) are further provided for each sub-array for example. After the test is performed, if any defective cell is found in the sub-array, the all the YSL lines are replaced with the spare YSL lines no matter where the defective cells are. Basically, each sub-array can be read or written with an amount of 8 (ports DQs). Therefore, the redundancy scheme can concurrently replace an amount of 4×8. In this scheme, when 1 of Q <31:0> has defective cell, Q0 shows failure result (="0" as in FIG. 6B), and the defective YSL can be replaced by a spare YSL according to the Q0 result.

In summary, according to the disclosure, by dividing the I/O buffers into even-numbered group and odd-numbered group and providing at least two data input pads and at least one data output pad, the test for the hyper-multi I/O memory can be easily and possibly implemented with fewer test I/O pad. In addition, the test can be done by providing the logic gates without increasing the complexity of the memory configuration. Without placing too many pads for testing the memory, the method and circuit can be easily applied to a memory configuration with extra large number of I/Os.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory with a test function, comprising:
   a memory array having cells and a plurality of input buffers and a plurality of output buffers, wherein the plurality of input buffers is divided into even-numbered input buffers and odd-numbered input buffers, and the plurality of output buffers is divided into even-numbered output buffers and odd-numbered output buffers;
   at least two data input pads, respectively providing test data to the cells through the even-numbered input buffers and the odd-numbered input buffers in a test write mode;
   a first logic gate, performing a first logic operation on all outputs of the even-numbered output buffers in a test read mode;
   a second logic gate, performing the first logic operation on all outputs of the odd-numbered output buffers in the test read mode; and
   a third logic gate, performing a second logic operation on outputs of the first and the second logic gates; and
   at least one data output pad, coupled to an output of the third logic gate for providing a test result of the cells.

2. The memory with a test function according to claim 1, wherein the first and the second logic gates are XOR gates, and the third logic gate is an NOR gate.

3. The memory with a test function according to claim 1, wherein the memory array further comprises a plurality of sub-arrays arranged in a matrix form, and
   each of the plurality of sub-arrays comprises a plurality of bit lines that are divided into a plurality of even-numbered bit-lines and a plurality of odd-numbered bit-lines,
   the even-numbered bit-lines and the odd-numbered bit-lines are interposed each other, and
   the test data from the even-numbered input buffers is written into the cells through the even-numbered bit-lines and the test data from the odd-numbered input buffers is written into the cells through the odd-numbered bit-lines.

4. The memory with a test function according to claim 3, wherein each of the plurality of sub-arrays further comprises:
   a first set of local I/O lines connected to the even-numbered bit-lines via respective sense amplifiers;
   a second set of local I/O lines connected to the odd-numbered bit-lines via respective sense amplifiers; and
   a set of main I/O lines intersected with the first set of local I/O lines and the second set of local I/O lines.

5. The memory with a test function according to claim 4, wherein a number of main I/O lines is equal to numbers of the first and the second set of the local I/O lines.

6. The memory with a test function according to claim 3, wherein each of the plurality of sub-arrays further comprises a predetermined number of spare bit-lines for replace a defective bit line in the sub-array.

7. The memory with a test function according to claim 6, the predetermined number of spare bit-lines are all replaced with the bit lines once the defective bit line in the sub-array is detected.

8. The memory with a test function according to claim 1, wherein the memory is a hyper-multi I/O semiconductor memory.

9. The memory with a test function according to claim 8, wherein the hyper-multi I/O semiconductor memory is a hyper-multi I/O DRAM.

10. A method for testing a memory, the memory having a memory array with a plurality of even-numbered and odd-numbered input buffers and a plurality of even-numbered and odd-numbered output buffers, the method comprising:
- writing test data into cells of the memory under test through the plurality of even-numbered and odd-numbered input buffers through at least two data input pads,
- reading the test data from the cells through the plurality of even-numbered and odd-numbered output buffers;
- performing a first logic operation on all outputs of the plurality of even-numbered output buffers to obtain a first logic value and on all outputs of the plurality of odd-numbered output buffers to obtain a second logic value;
- performing a second logic operation on the first and the second logic values to output a third logic value on at least one data output pad; and
- determines whether the cells are defective or not based on the third logic value.

11. The method for testing a memory according to claim 10, wherein the test data from one of the at least two data input pads is consecutively burst written into the even-numbered input buffers, and the test data from another one of the at least two data input pads is consecutively burst written into the odd-numbered input buffers.

12. The method for testing a memory according to claim 10, wherein the first logic operation is XOR and the second logic operation is NOR.

13. The method for testing a memory according to claim 10, wherein the memory array further comprises a plurality of sub-arrays arranged in a matrix form, and each of the plurality of sub-arrays comprises a plurality of bit lines that are divided into a plurality of even-numbered bit-lines and a plurality of odd-numbered bit-lines, and the method further comprises:
- writing the test data from the even-numbered input buffers to the cells through the even-numbered bit-lines, and
- writing the test data from the odd-numbered input buffers to the cells through the odd-numbered bit-lines.

14. The method for testing a memory according to claim 13, wherein each of the plurality of sub-arrays further comprises a predetermined number of spare bit-lines, and the method comprises:
- replacing a defective bit line in the sub-array with the predetermined number of spare bit-lines.

15. The method for testing a memory according to claim 14, wherein the predetermined number of spare bit-lines are all replaced with the bit lines once the defective bit line in the sub-array is detected.

16. The method for testing a memory according to claim 10, wherein the memory is a hyper-multi I/O semiconductor memory.

17. The method for testing a memory according to claim 16, wherein the hyper-multi I/O semiconductor memory is a hyper-multi I/O DRAM.

* * * * *